(12) United States Patent
Zhao et al.

(10) Patent No.: US 12,105,127 B2
(45) Date of Patent: Oct. 1, 2024

(54) DETECTION CIRCUIT AND APPARATUS BASED ON EQUIPOTENTIAL SHIELDING

(71) Applicant: KINGFAR INTERNATIONAL INC., Beijing (CN)

(72) Inventors: Qichao Zhao, Beijing (CN); Ran Yang, Beijing (CN); Zhao Li, Beijing (CN)

(73) Assignee: KINGFAR INTERNATIONAL INC., Beijing (CN)

( * ) Notice: Subject to any disclaimer, the term of this patent is extended or adjusted under 35 U.S.C. 154(b) by 167 days.

(21) Appl. No.: 18/088,931

(22) Filed: Dec. 27, 2022

(65) Prior Publication Data

US 2024/0036091 A1 Feb. 1, 2024

(30) Foreign Application Priority Data

Jul. 29, 2022 (CN) .......................... 202210909464.9

(51) Int. Cl.
*G01R 27/02* (2006.01)
*G01L 1/18* (2006.01)
*G01R 1/30* (2006.01)

(52) U.S. Cl.
CPC ............... *G01R 27/02* (2013.01); *G01L 1/18* (2013.01); *G01R 1/30* (2013.01)

(58) Field of Classification Search
CPC ........ G01R 27/02; G01R 1/30; G01R 31/367; G01L 1/18; H02J 7/0068; H01M 10/44
USPC .. 324/713, 415, 437, 425–435, 126, 756.05, 324/538, 500–530, 76.11
See application file for complete search history.

(56) References Cited

U.S. PATENT DOCUMENTS

2015/0331523 A1* 11/2015 McMillen ................ A43B 3/34
345/174
2023/0214044 A1* 7/2023 Hong .................... G06F 3/0412
345/174

FOREIGN PATENT DOCUMENTS

| CN | 107631818 A | 1/2018 |
| CN | 110617842 A | 12/2019 |
| CN | 111537117 A | 8/2020 |
| CN | 112202335 A | 1/2021 |
| CN | 113483923 A | 10/2021 |

* cited by examiner

*Primary Examiner* — Alexander Satanovsky
*Assistant Examiner* — Trung Q Nguyen
(74) *Attorney, Agent, or Firm* — Cooper Legal Group, LLC

(57) ABSTRACT

Disclosed are a detection circuit and apparatus based on equipotential shielding. A first connection end of a row control circuit, configured to be connected to a row lead of an array piezoresistive sensor; a control end of the row control circuit, connected to a main control chip for outputting a control signal; a second connection end of the row control circuit, connected to a first power supply terminal; and a row pull-up resistor, with an end connected to the row lead and another end connected to a second power supply terminal. Herein, each row lead corresponds to one row pull-up resistor; each column lead of the array piezoresistive sensor is connected to an input end of an inverse adder; an output end of the inverse adder is connected to a first connection end of the column control circuit.

7 Claims, 9 Drawing Sheets

DETECTION CIRCUIT AND APPARATUS BASED ON EQUIPOTENTIAL SHIELDING

CROSS-REFERENCE TO RELATED APPLICATION

This application claims the priority and benefit of Chinese patent application No. 202210909464.9, filed on Jul. 29, 2022. The entirety of Chinese patent application No. 202210909464.9 is hereby incorporated by reference herein and made a part of this specification.

TECHNICAL FIELD

The present disclosure relates to the technical field of sensors, and more particularly, to a detection circuit and apparatus based on equipotential shielding.

BACKGROUND ART

An array piezoresistive sensor is used for detecting the magnitude of a force applied thereupon and includes a plurality of contact elements. Once the contact elements are forced, a corresponding change in a resistance value is observed, and the magnitude of the force applied upon the contact elements may be derived from the change in the resistance value.

However, since the contact elements in rows and columns are connected to form a resistance network, even if one of the contact elements is selected for detection, the loop interference among the contact elements will lead to an inaccurate detection result of the resistance value of the selected contact element, and accordingly, the magnitude of the force derived therefrom is inaccurate.

SUMMARY

It is an object of the present disclosure to provide a detection circuit and apparatus based on equipotential shielding, so as to increase the accuracy of a detection result of an array piezoresistive sensor.

In a first aspect, the following technical solutions are employed for the detection circuit and apparatus based on equipotential shielding provided by the present disclosure.

A detection circuit based on equipotential shielding for detecting an array piezoresistive sensor is provided, and the array piezoresistive sensor includes a plurality of contact elements, a plurality of row leads, and a plurality of column leads; an end of each of the plurality of contact elements is connected to one of the plurality of row leads, and another end of each of the plurality of contact elements is connected to one of the plurality of column leads; the detection circuit includes at least one group of row control circuits, a row pull-up resistor, at least one group of column control circuits, multiple groups of shielding circuits, an ADC module, a first power supply terminal, and a second power supply terminal, where each group of the shielding circuits includes an inverse adder and the row pull-up resistor;

a first connection end of each group of the row control circuits is configured to be connected to the row lead of the array piezoresistive sensor; a control end of each group of the row control circuit is connected to a main control chip for outputting a control signal; a second connection end of each group of the row control circuit is connected to the first power supply terminal; the row pull-up resistor is connected to the row lead; another end of the row pull-up resistor is connected to the second power supply terminal; each of the row leads corresponds to one of the row pull-up resistors; each column lead of the array piezoresistive sensor is connected to one input end of the inverse adder; an output end of the inverse adder is connected to a first connection end of the column control circuit, a reference voltage end of the inverse adder is connected to the second power supply terminal a control end of each group of the column control circuits is connected to the main control chip, and a second connection end of each group of the column control circuits is connected to the ADC module;

the row control circuit is configured to receive the control signal of the main control chip to perform row collection;

the column control circuit is configured to receive the control signal of the main control chip to perform column collection;

the row control circuit and the column control circuit cooperate to select contact elements to be detected from the plurality of contact elements;

the column control circuit receives a collection signal of the inverse adder and transmits the collection signal to the ADC module;

the ADC module is configured to convert the collection signal that is received into a digital signal and transmit the same to the main control chip;

the shielding circuit is configured to provide a potential for unselected contact elements so that equal potentials are enabled at both ends of the unselected contact elements;

a voltage of the first power supply terminal is different from a voltage of the second power supply terminal.

In the above technical solution, the main control chip selects a contact element by using the row control circuit and the column control circuit and detects the selected contact element by calculating a resistance value of the selected contact element given the difference of voltages of the first power supply terminal and the second power supply terminal, that is, a pressure difference, and deriving the magnitude of the corresponding force applied thereupon according to the resultant resistance value. Moreover, since the shielding circuit can provide equal potentials at both ends of unselected contact elements, even if the resistance value of the unselected contact elements changes, no current passes through the unselected contact elements, which reduces the possibility of the current passing through the unselected contact elements and affecting the detection result, hence the accuracy of the detection result is increased.

Optionally, the inverse adder includes an operational amplifier, a resistor A, and a resistor B, where an end of the resistor A is connected to the column lead, and another end of the resistor A is connected to a negative input end of the operational amplifier; an end of the resistor B is connected to the negative input end of the operational amplifier, and another end of the resistor B is connected to an output end of the operational amplifier; the output end of the operational amplifier is connected to the first connection end of the column control circuit, and a positive input end of the operational amplifier is connected to the second power supply terminal.

In the above technical solution, the inverse adder is built with the operational amplifier as the core. The inverse adder outputs a voltage value to an ADC module, and performs an inverse calculation according to the voltage value received by the ADC module, so as to derive the resistance value of the contact element for the subsequent calculation. Moreover, according to the virtual-short-virtual-open principle of the operational amplifier, one end of the unselected contact elements may be provided with a potential, and the other end of the unselected contact elements is provided with an equal potential by the row pull-up resistor, so that the potentials of both ends of the unselected contact elements are equal.

Optionally, each of the row control circuits includes a multiline controller A, where a control pin and an enable pin of the multiline controller A are both connected to the control end of the row control circuit; a second connection pin of the multiline controller A is connected to a ground end, and a plurality of first connection pins of the multiline controller A are connected to the first connection end of the row control circuit; each of the column control circuits includes a multiline controller B, and an enable pin and a control pin of the multiline controller B are both connected to the control end of the column control circuit; a plurality of first connection pins of the multiline controller B are connected to the first connection end of the column control circuit, and a second connection pin of the multiline controller B is connected to the second connection end of the column control circuit.

In the above technical solution, the multiline controller is used for controlling, whereby the control of a collection row and a collection column is enabled, and thus a contact element to be detected is selected.

Optionally, a decoupling capacitor A is connected to a power supply pin of the multiline controller B, and another end of the decoupling capacitor A is connected to the ground end.

In the above technical solution, a current impulse generated in the circuit is prevented from affecting the normal operation of the circuit when the magnitude of the circuit current changes, and the decoupling capacitor can effectively eliminate the parasitic coupling between the circuits.

Optionally, a decoupling capacitor B is connected to a positive electrode of the operational amplifier, and another end of the decoupling capacitor B is connected to the ground end.

In the above technical solution, a current impulse generated in the circuit is prevented from affecting the normal operation of the circuit when the magnitude of the circuit current changes, and the decoupling capacitor can effectively eliminate the parasitic coupling between the circuits.

Optionally, the first connection end of the row control circuit is provided with an interface T2, the input end of the inverse adder is provided with an interface T1, and the input ends of all the inverse adders are all connected to the interface T1.

In the above technical solution, the connection through the interface improves convenience.

In a second aspect, the following technical solution is employed for an apparatus for detecting an array piezoresistive sensor provided by the present disclosure.

An apparatus for detecting an array piezoresistive sensor, including the detection circuit based on equipotential shielding for detecting an array piezoresistive sensor according to the first aspect.

In summary, the present disclosure is advantageous in at least one of the following aspects.

1. In the above technical solution, the main control chip selects a contact element by using the row control circuit and the column control circuit and detects the selected contact element by calculating a resistance value of the selected contact element given the difference of voltages of the first power supply terminal and the second power supply terminal, that is, a pressure difference, and deriving the magnitude of the corresponding force applied thereupon according to the resultant resistance value. Moreover, since the shielding circuit can provide equal potentials at both ends of unselected contact elements, even if the resistance value of the unselected contact elements changes, no current passes through the unselected contact elements, which reduces the possibility of the current passing through the unselected contact elements and affecting the detection result, hence the accuracy of the detection result is increased.

2. In the above technical solution, the inverse adder is built with the operational amplifier as the core. The inverse adder outputs a voltage value to an ADC module, and performs an inverse calculation according to the voltage value received by the ADC module, so as to derive the resistance value of the contact element for the subsequent calculation. Moreover, according to the virtual-short-virtual-open principle of the operational amplifier, one end of the unselected contact elements may be provided with a potential, and the other end of the unselected contact elements is provided with an equal potential by the row pull-up resistor, so that the potentials of both ends of the unselected contact elements are equal.

DETAILED DESCRIPTION

The present disclosure is described in further detail below with reference to FIGS. 1 to 10 and embodiments. It should be understood that the particular embodiments described herein are illustrative only and are not restrictive.

Figure 1:
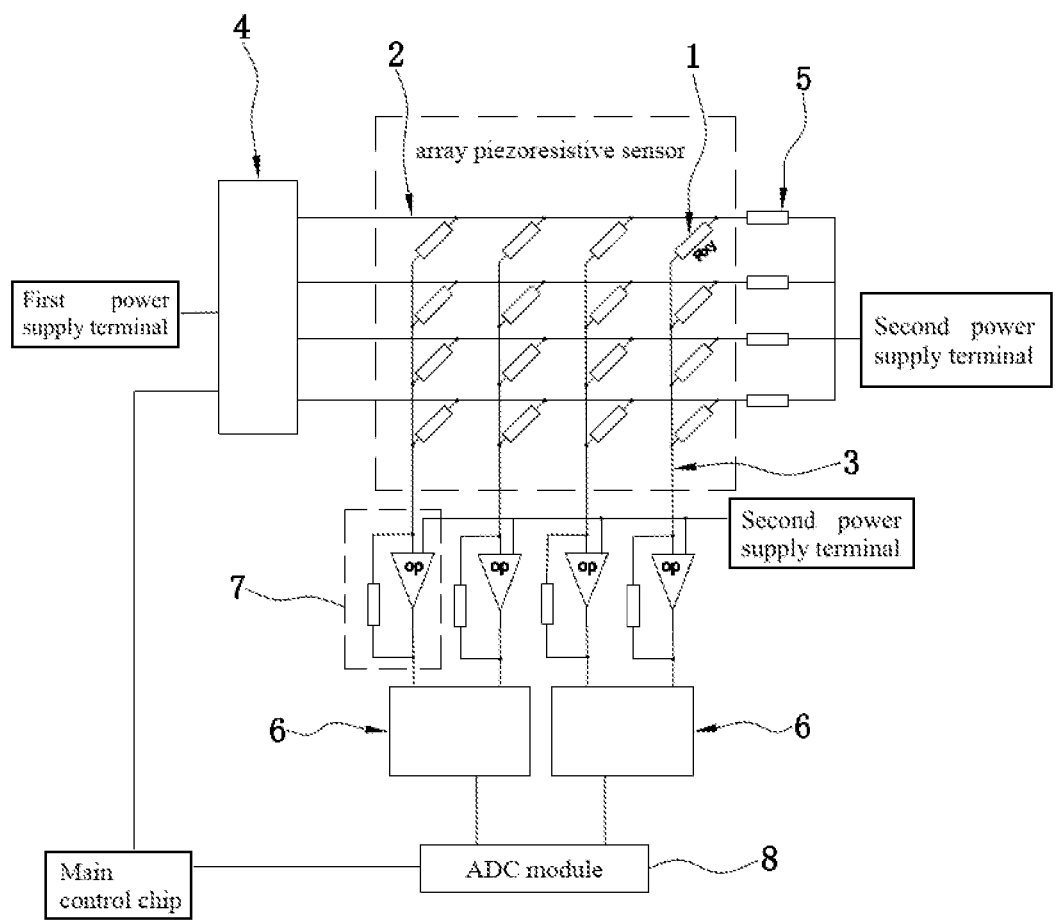
FIG. 1 is a simplified diagram of a circuit connection according to an embodiment of the present disclosure.

A detection circuit based on equipotential shielding for detecting an array piezoresistive sensor disclosed in this embodiment is applied to the detecting the array piezoresistive sensor. With reference to FIG. 1, the array piezoresistive sensor includes a plurality of contact elements 1, a plurality of row leads 2, and a plurality of column leads 3, where the plurality of contact elements 1 are connected to the row lead 2, and another end of the contact element 1 is connected to the column lead 3, as shown in FIG. 1, which is only illustrative. The detection circuit based on equipotential shielding for detecting an array piezoresistive sensor is taken to detect a resistance value of the contact element 1, and then calculate a force applied upon a selected contact element.

According to the arrangement of the contact elements in FIG. 1, the horizontal lines are denoted by the row lead 2 and the vertical lines are denoted by the column lead 3.

FIG. 1 is a simplified diagram without showing all the details of this embodiment, and is intended only for a better understanding of how the parts are connected.

Figure 2:
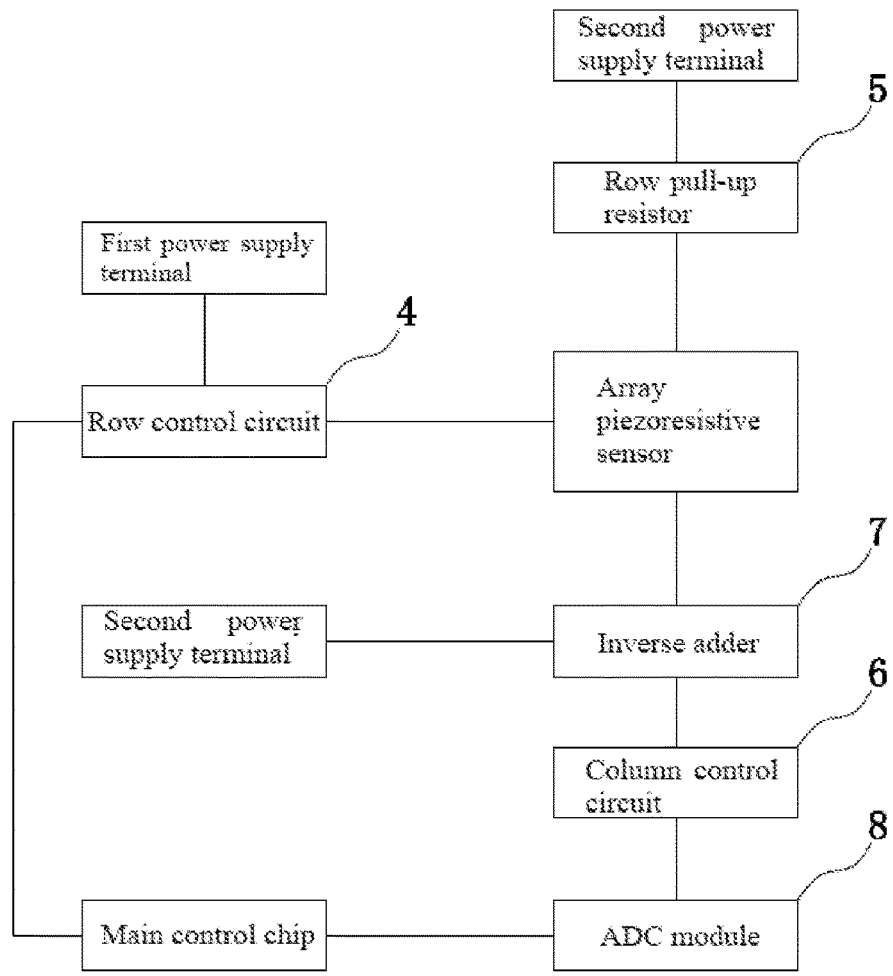
FIG. 2 is a block diagram of an overall connection according to an embodiment of the present disclosure.

Referring to FIGS. 1 and 2, a detection circuit based on equipotential shielding for detecting an array piezoresistive sensor includes at least one group of row control circuits 4, a row pull-up resistor 5, at least one group of column control circuits 6, a plurality of groups of shielding circuits, an ADC module 8, a first power supply terminal, and a second power supply terminal, where each group of the shielding circuits includes an inverse adder 7 and the row pull-up resistor 5.

A first connection end of the row control circuit 4 is connected to the row lead 2, a control end of the row control circuit 4 is connected to a main control chip for outputting a control signal, and a second connection end of the row control circuit 4 is connected to the first power supply terminal; the row pull-up resistor 5 is connected to the row lead 2, another end of the row pull-up resistor 5 is connected to the second power supply terminal, and each row lead 2 corresponds to one row pull-up resistor 5; each column lead 3 of the array piezoresistive sensor is connected to an input end of the inverse adder 7, and an output end of the inverse adder 7 is connected to a first connection end of the column control circuit 6; a reference voltage end of the inverse adder 7 is connected to the second power supply terminal, and a control end of the column control circuit 6 is connected to the main control chip; a second connection end of the column control circuit 6 is connected to the ADC module 8, and a voltage of the first power supply terminal is different from a voltage of the second power supply terminal.

After the main control chip sends the control signal, the row control circuit 4 and the column control circuit 6 are taken to select a certain contact element 1; the main control chip calculates a resistance value of the selected contact element 1 according to a digital signal sent by the ADC module 8 and a resistance parameter in the circuit; at the same time, the inverse adder 7 is taken to provide a voltage for unselected contact elements 1 so that the voltages at both ends of the unselected contact elements 1 are equal; in this case, the unselected contact elements 1 will have no current passing therethrough even if a resistance value thereof changes due to a force applied thereupon, thereby achieving an equipotential shielding effect, avoiding affecting the calculation of the resistance value of the selected contact element 1, and improving the accuracy of the detection result.

After the circuit is made, the resistance parameter in the circuit will have the given parameters in the circuit programmed thereinto during programming so that a corresponding calculation algorithm in the program can operate to obtain the resistance value of the selected contact element. The ADC module 8 is a digital-to-analog conversion module for converting an analog signal into the digital signal.

In this embodiment, four groups of the row control circuits 4 are used, each group of the row control circuits 4 can control eight rows of contact elements 1, and one row pull-up resistor 5 is connected to each row lead 2, hence thirty-two row pull-up resistors 5 are required; eight groups of the column control circuits 6 are used, each group of the column control circuits 6 controls four columns of the contact elements 1, and one inverse adder 7 is connected to each column of the contact elements 1, hence thirty-two inverse adders 7 are required. That is to say, the array piezoresistive sensor has 1024 contact elements 1.

Figure 3:
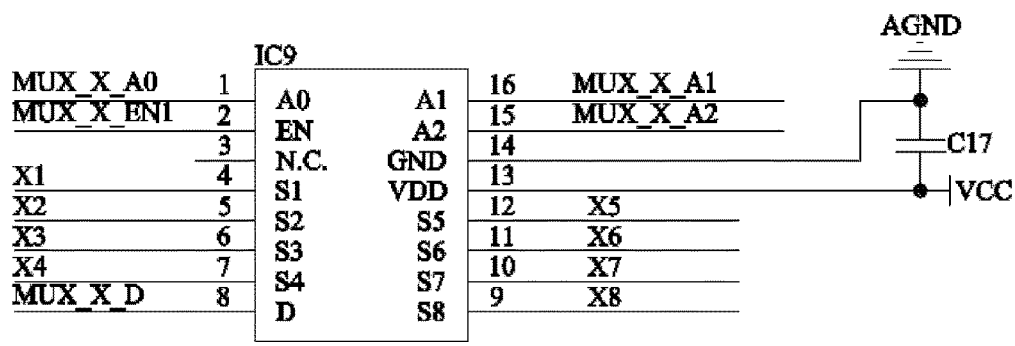
FIG. 3 is a schematic diagram explaining a row control circuit according to an embodiment of the present disclosure.

With reference to FIG. 3, specifically, taking one group of the row control circuits 4 as an example, the row control circuit 4 includes a multiline controller A, where the multiline controller A is shown as a multiline controller IC9, control pins (A0, A1 and A2) and an enable pin (EN) of the multiline controller IC9 are both connected to the control end of the row control circuit 4, that is, the control pins (A0, A1 and A2) and the enable pin (EN) of the multiline controller IC9 are both connected to the main control chip; an output pin (D) of the multiline controller IC9 is connected to the first power supply terminal, and input pins (S1 to S8) of the multiline controller IC9 are connected to the first connection end of the row control circuit.

The detection circuit based on equipotential shielding for detecting an array piezoresistive sensor further includes a third power supply terminal VCC, where the third power supply terminal VCC is connected to a power supply pin (VDD) of the multiline controller IC9; a decoupling capacitor C17 is connected to the third power supply terminal VCC, another end of the decoupling capacitor C17 is connected to a ground end, and a ground pin (GND) of the multiline controller IC9 is connected to the ground end.

The third power supply terminal VCC not only supplies power to the multiline controller IC9, but also supplies power to the multiline controllers in other row control circuits 4.

Figure 4:
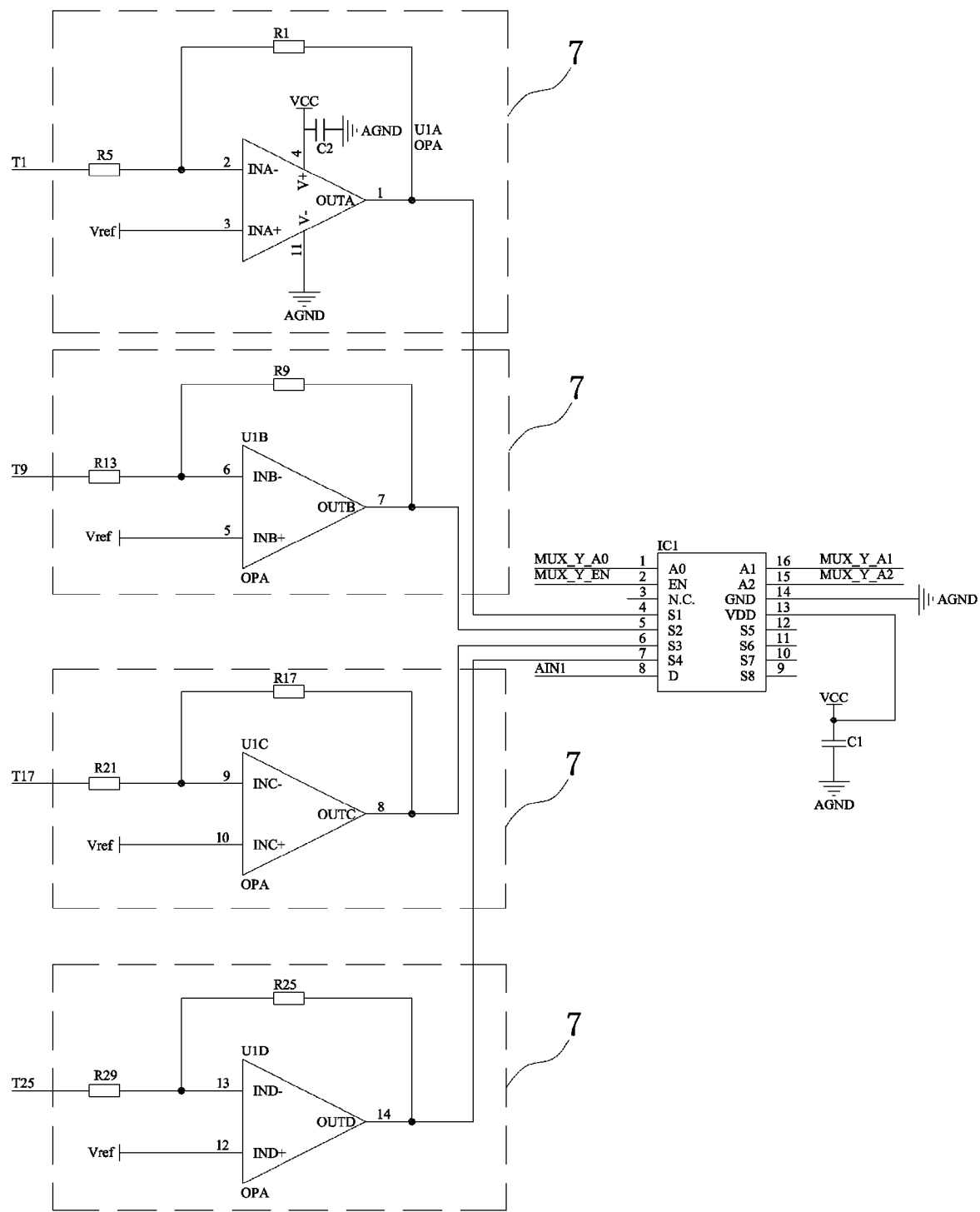
FIG. 4 is a schematic diagram explaining a column control circuit and an inverse adder according to an embodiment of the present disclosure.

With reference to FIG. 4, specifically, taking one inverse adder 7 and one group of the column control circuits 6 as an example, the column control circuit 6 includes a multiline controller B, where the multiline controller B is shown as a multiline controller IC1; control pins (A0, A1, A2) and an enable pin (EN) of the multiline controller IC1 are both connected to the control end of the column control circuit 6, that is, the control pins (A0, A1, A2) and the enable pin (EN) of the multiline controller IC1 are both connected to the main control chip; a second connection pin (D) of the multiline controller IC1 is connected to the second connection end of the column control circuit 6, that is, the second connection pin (D) of the multiline controller IC1 is connected to the ADC module 8; four first connection pins (S1 to S4) of the multiline controller IC1 are connected to the first connection end of the column control circuit 6, that is, the four first connection pins (S1 to S4) of the multiline controller IC1 are connected to the output end of the inverse adder 7; moreover, the four first connection pins of the multiline controller IC1 each correspond to one inverse adder 7. A power supply pin (VDD) of the multiline controller IC1 is connected to the third supply terminal VCC, a decoupling capacitor A is connected to the third supply terminal VCC, and another end of the decoupling capacitor A is connected to the ground end. In FIG. 4, the decoupling capacitor A is a capacitor C1.

In addition, the power supply pin of the multiline controller B in each group of the column control circuits 6 is connected to the decoupling capacitor A. The decoupling capacitor is used to prevent a current impulse generated in the circuit from affecting the normal operation of the circuit when the magnitude of the circuit current changes, that is, the decoupling capacitor can effectively eliminate the parasitic coupling between the circuits. The decoupling capacitor C17 functions the same as the decoupling capacitor A.

The third supply terminal VCC not only supplies power to the multiline controller IC1, but also supplies power to the multiline controllers in other column control circuits 6.

The inverse adder 7 includes an operational amplifier (the operational amplifier U1A in FIG. 4), a resistor A (the resistor R5 in FIG), and a resistor B (the resistor R1 in FIG. 4). One end of the resistor R5 is connected to the input end of the inverse adder 7, and another end of the resistor R5 is connected to a negative input end of the operational amplifier U1A; one end of the resistor R1 is connected to the negative input end of the operational amplifier U1A, and another end of the resistor R1 is connected to an output end of the operational amplifier U1A; a positive input end of the operational amplifier U1A is connected to the reference voltage end, that is, the positive input end of the operational amplifier U1A is connected to the second power supply terminal. A positive electrode of the operational amplifier U1A is connected to the third supply terminal VCC, a negative electrode of the operational amplifier U1A is connected to the ground end, and the positive electrode of the operational amplifier U1A is further connected to a decoupling capacitor B, where the decoupling capacitor B is a decoupling capacitor C2 in FIG. 4, and another end of the decoupling capacitor C2 is connected to the ground end. The decoupling capacitor B functions the same as the decoupling capacitor A.

Herein, the positive electrode of the operational amplifier U1A is connected to the third supply terminal VCC, the negative electrode of the operational amplifier U1A is connected to the ground end, and the third supply terminal VCC supplies power for the operational amplifier U1A and also supplies power for operational amplifiers in other shielding circuits. Since the four operational amplifiers in FIG. 4 are integrated, it is only shown on the circuit connection that the operational amplifier U1A is connected to the third power supply terminal VCC and the ground end, but actually the four operational amplifiers in FIG. 4 are all connected to the third power supply terminal VCC and the ground end.

As such, FIG. 4 is illustrative, since in this embodiment thirty-two groups of inverse adders 7 are used, and other inverse adders 7 are connected in the same manner as the inverse adder 7 shown in FIG. 4.

Figure 5:
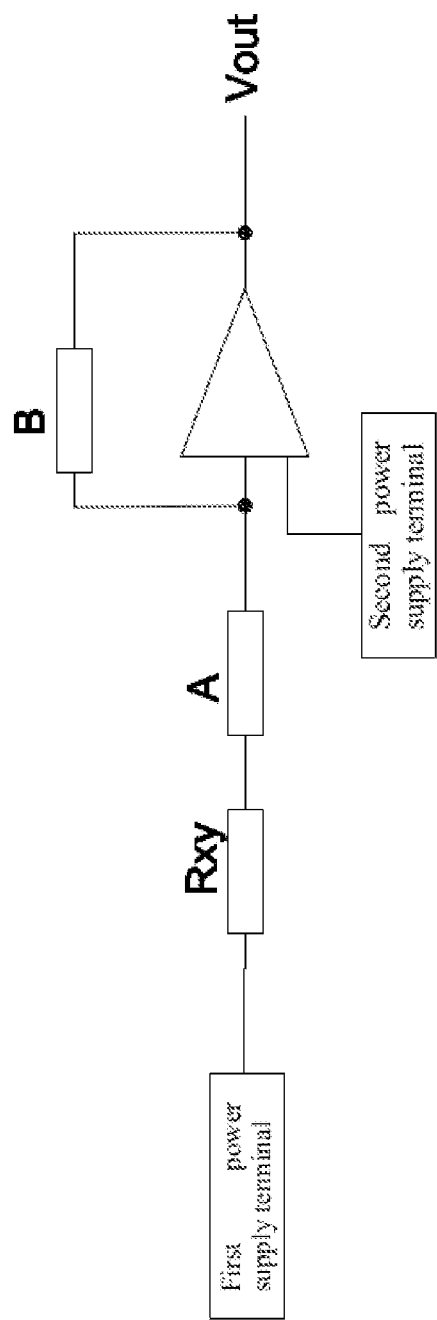
FIG. 5 is a simplified circuit diagram of a selected contact element according to an embodiment of the present disclosure.
Figure 6:
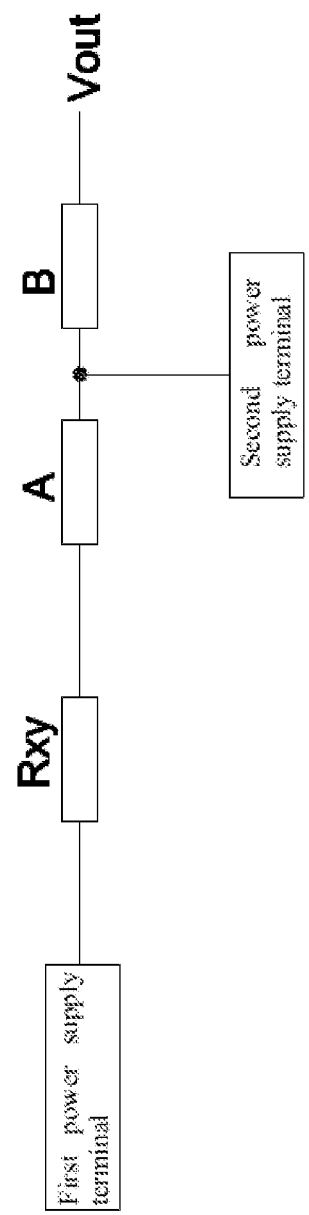
FIG. 6 is a calculation diagram of the selected contact element according to an embodiment of the present disclosure.

According to the above circuit, a calculation is performed to explain why the shielding circuit can play a shielding role so as to reduce the influence of the unselected contact elements 1 on the detection result. Firstly, the resistance value of the selected contact element is calculated, from which the magnitude of the force applied is derived, and the circuit at the operational amplifier is simplified, as shown in FIG. 5. In this embodiment, the resistance value of the contact element 1 is Rxy, the resistance value of the resistor A is Ra, Ra being equal to 1000 Ohms, the resistance value of the resistor B is Rb, Rb being equal to 1000 Ohms; the voltage at the first power supply terminal is zero, and the voltage at the second power supply terminal is 1.5V; the ADC module 8 acquires a voltage Vout at the output end of the operational amplifier through the output pin (D) of the multiline controller B, that is, the voltage Vout is given; according to the virtual-short-virtual-open principle of the operational amplifier, a first calculation diagram is obtained, and the first calculation diagram is as shown in FIG. 6.

According to the first calculation diagram, the following equation may be obtained:

$$\frac{Vout - 1.5}{Rb} = \frac{1.5\ V - 0}{Rxy + Ra};$$ Equation (1)

Equation (1) above can be reduced to $$Rxy = \frac{3000 - 1000 Vout}{Vout - 1.5};$$ Equation (2)

According to Equation (2), the resistance value Rxy of the selected contact element 1 can be calculated, and the corresponding magnitude of the force applied can be derived from the resistance value of the contact element 1, thereby enabling the detection of the magnitude of the force applied by using the contact element 1.

Figure 7:
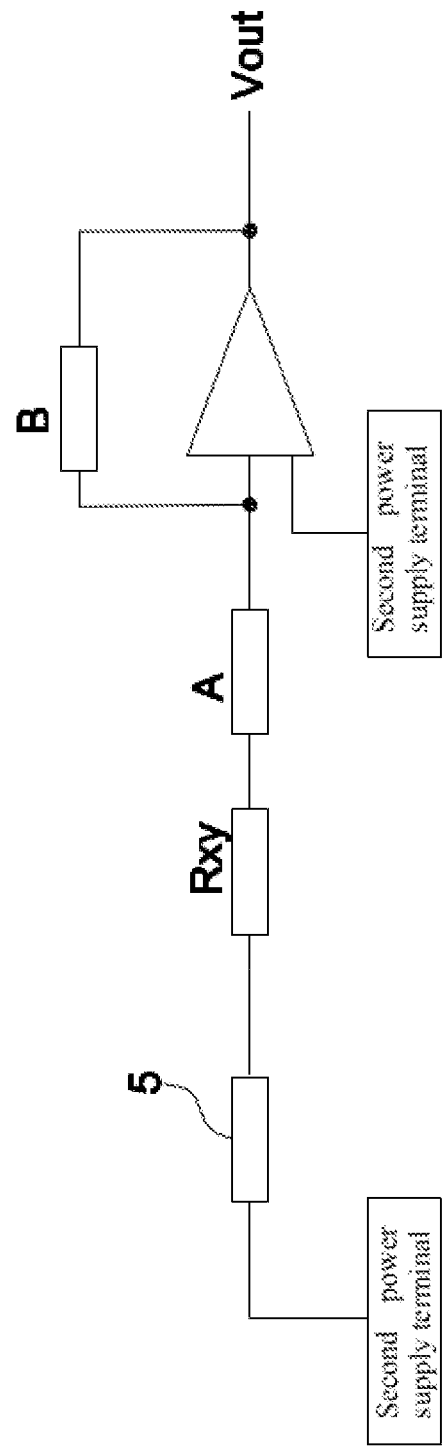
FIG. 7 is a schematic diagram explaining an unselected contact element and a shielding circuit according to an embodiment of the present disclosure.
Figure 8:
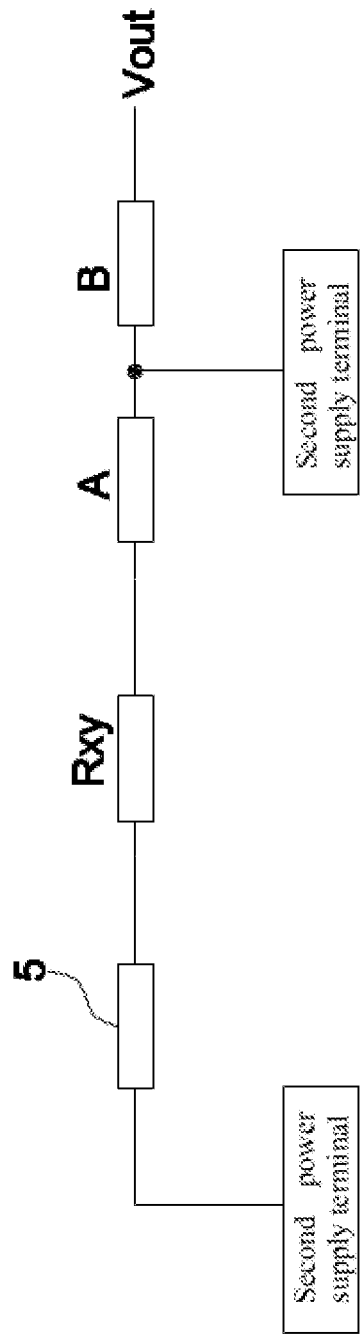
FIG. 8 is a calculation diagram of the unselected contact element according to an embodiment of the present disclosure.

The unselected contact elements are described below. A simplified circuit of the unselected contact elements 1 in the same column as the selected contact element is shown in FIG. 7. A second calculation diagram can be obtained according to the virtual-short-virtual-open principle of the operational amplifier, and the second calculation diagram is shown in FIG. 8. From the second calculation diagram, it can be seen that the row pull-up resistor 5 is connected to the second power supply terminal, and the voltage at one end of the resistor A is equal to the voltage provided by the second power supply terminal; since the voltages are equal, that is, there is no change in the electromotive force, no current passes through the unselected contact element 1 even if the resistance value changes, that is, the shielding circuit plays a shielding role. Since no current passes through the unselected contact element 1, the selected contact element 1 will not be affected, that is, it can be understood that the unselected contact elements 1 do not exist in the circuit, in other words, they are shielded. Therefore, the accuracy is higher when detecting the selected contact element 1.

The voltage values of the first power supply terminal and the second power supply terminal may vary, and the voltage values given above are illustrative; however, the voltage values of the first power supply terminal and the second power supply terminal need to be different, that is, there is a difference between the voltages.

Figure 9:
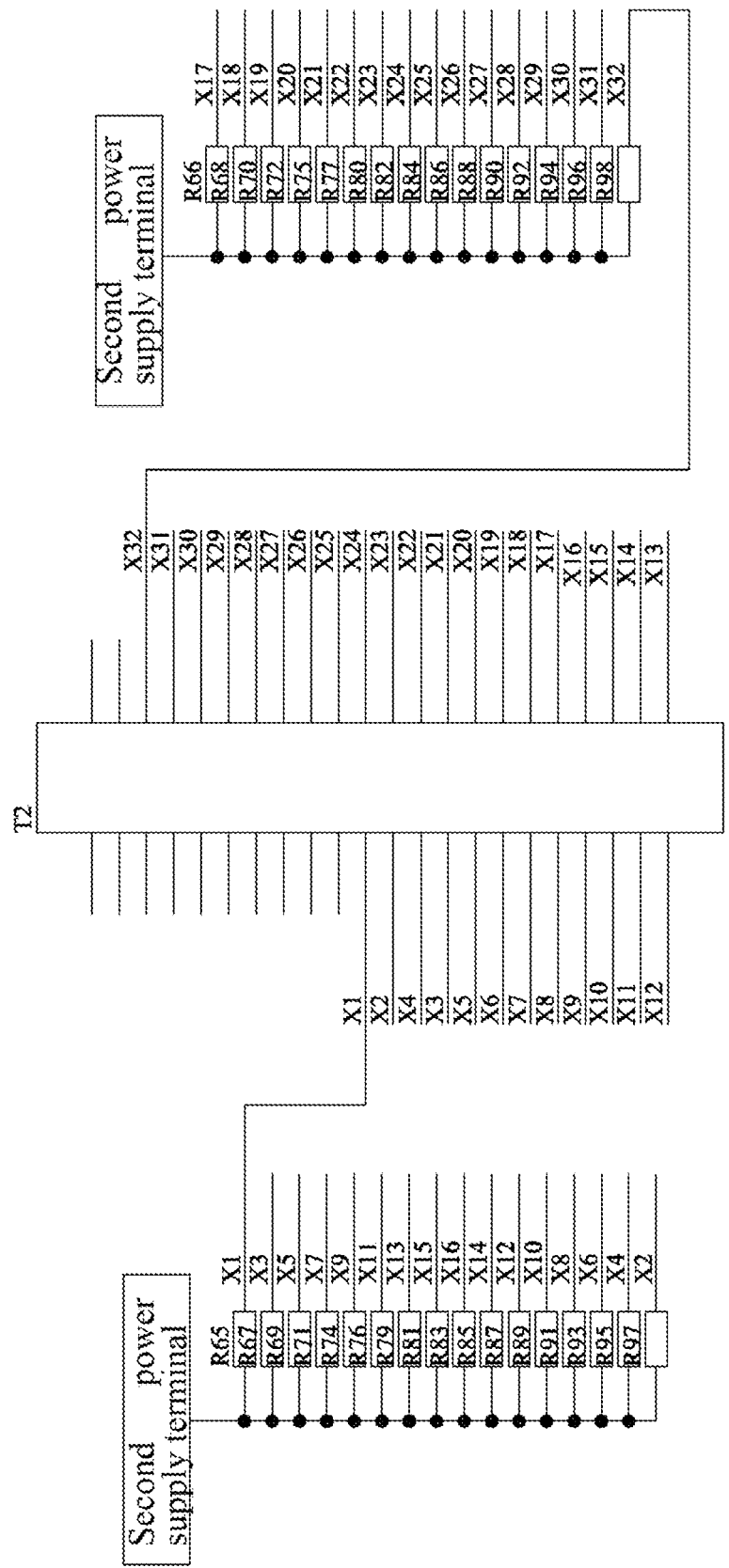
FIG. 9 is a schematic diagram explaining an interface T2 and a row pull-up resistor according to an embodiment of the present disclosure.
Figure 10:
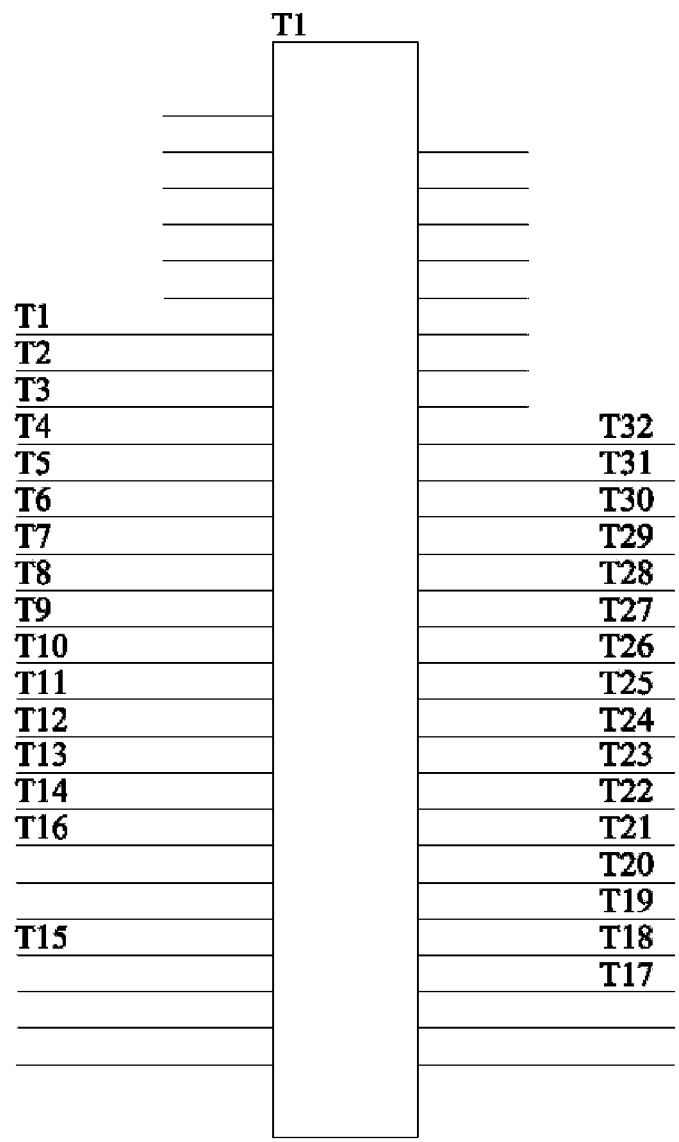
FIG. 10 is a schematic diagram explaining an interface T1 according to an embodiment of the present disclosure.

With reference to FIGS. 9 and 10, the first connection end of the row control circuit 4 is provided with an interface T2, and the first connection ends of all the row control circuits 4 are all connected to the interface T2; the input end of the inverse adder 7 is provided with an interface T1, and the input ends of all the inverse adders 7 are all connected to the interface T1. The interface T1 and the interface T2 are used for the connection with the row lead 1 and the column lead 2 of the array piezoresistive sensor, which facilitates disassembling and assembling and avoids connection errors. If the interface T1 and the interface T2 are not provided, too many connection lines are not easy to be disassembled and assembled, and connection errors are likely to happen at the time of installation.

Resistors R65 through R98 in FIG. 9 are all row pull-up resistors 5. Since the array piezoresistive sensor in this embodiment has thirty-two row leads 3, there are correspondingly thirty-two row pull-up resistors 5.

In this embodiment, the multiline controller A, the multiline controller B, the resistor A, the resistor B, the decoupling capacitor A, and the decoupling capacitor B are all generally named; since there are many similar devices in this embodiment, A and B are used as general designations, and in the detailed description, the devices are all denoted specifically in the drawings.

The detection circuit based on equipotential shielding for detecting an array piezoresistive sensor according to an embodiment of the present disclosure works as follows. The interface T1 and the interface T2 are connected to the array piezoresistive sensor; the main control chip sends a control signal; one contact element 1 is selected using the row control circuit 4 and the column control circuit 6; the resistance value of the selected contact element 1 is calculated using the detected current and voltage, so as to derive the corresponding magnitude of the force applied from the resistance value of the contact element 1, that is, to acquire the magnitude of the force applied upon the contact element 1.

The above selection process is enabled as follows. The main control chip controls the multiline controller A and the multiline controller B to enable one path of the multiline controller A to conduct and enable one path of the multiline controller B to conduct, and then one contact element can be selected.

In the detection process, the shielding circuit provides an electric potential so that the voltages at both ends of the unselected contact elements 1 are the same, that is, even if the resistance value of the unselected contact elements 1 changes, no current passes through the unselected contact elements 1, hence the detection of the selected contact element 1 is not affected, and the accuracy of the detection result is improved.

This present disclosure further discloses an apparatus for detecting an array piezoresistive sensor. The apparatus for detecting an array piezoresistive sensor includes the detection circuit based on equipotential shielding for detecting an array piezoresistive sensor as disclosed in the above embodiment.

The foregoing are preferred embodiments of the present disclosure and are not intended to limit the scope of the present disclosure. Any feature disclosed in this specification (including the abstract and drawings) may be replaced with alternative features serving equivalent or similar purposes, unless expressly stated otherwise. That is to say, unless expressly stated otherwise, each feature is one example only of a generic series of equivalent or similar features.

What is claimed is:

1. A detection circuit based on equipotential shielding for detecting an array piezoresistive sensor, the array piezoresistive sensor comprises a plurality of contact elements, a plurality of row leads and a plurality of column leads, an end of each of the plurality of contact elements is connected to one of the plurality of row leads and a second end of each of the plurality of contact elements is connected to one of the plurality of column leads, wherein, the detection circuit comprises at least one group of row control circuits, at least one group of column control circuits, multiple groups of shielding circuits, an analog-to-digital converter (ADC) module, a first power supply terminal, and a second power supply terminal, each group of the multiple groups of shielding circuits comprises an inverse adder and a row pull-up resistor;

a first connection end of each group of the at least one group of row control circuits is configured to be connected to the plurality of row leads of the array piezoresistive sensor; a control end of each group of the at least one group of row control circuits is connected to a main control chip for outputting a control signal; a second connection end of each group of the at least one group of row control circuits is connected to the first power supply terminal; the row pull-up resistor is connected to the plurality of row leads; another end of the row pull-up resistor is connected to the second power supply terminal; each of the plurality of row leads corresponds to one of the row pull-up resistors; each column lead of the array piezoresistive sensor is connected to one input end of the inverse adder; an output end of the inverse adder is connected to a first connection end of the at least one group of column control circuits, a reference voltage end of the inverse adder is connected to the second power supply terminal, a control end of each group of the at least one group of column control circuits is connected to the main control chip, and a second connection end of each group of the at least one group of column control circuits is connected to the ADC module;

the at least one group of row control circuits is configured to receive a first control signal from the main control chip to perform a row collection;

the at least one group of column control circuits is configured to receive a second control signal from the main control chip to perform a column collection;

the at least one group of row control circuits and the at least one group of column control circuits are configured to cooperate to select a contact element to be detected from the plurality of contact elements;

the at least one group of column control circuits is configured to receive a collection signal of the inverse adder and transmit the collection signal to the ADC module;

the ADC module is configured to convert the received collection signal into a digital signal and transmit the digital signal to the main control chip;

the multiple groups of shielding circuits are configured to provide a potential for unselected contact elements so that equal potentials are enabled at both ends of the unselected contact elements;

a voltage of the first power supply terminal is different from a voltage of the second power supply terminal.

2. The detection circuit based on equipotential shielding for detecting an array piezoresistive sensor according to claim 1, wherein, the inverse adder comprises an operational amplifier, a first resistor, and a second resistor, wherein an end of the first resistor is connected to one of the plurality of column leads, and another end of the first resistor is connected to a negative input end of the operational amplifier; an end of the second resistor is connected to the negative input end of the operational amplifier, and another end of the second resistor is connected to an output end of the operational amplifier; the output end of the operational amplifier is connected to the first connection end of the at least one group of column control circuits, and a positive input end of the operational amplifier is connected to the second power supply terminal.

3. The detection circuit based on equipotential shielding for detecting an array piezoresistive sensor according to claim 1, wherein each of the at least one group of row control circuits comprises a first multiline controller, wherein a control pin and an enable pin of the first multiline controller are both connected to the control end of the at least one group of row control circuits; a second connection pin of the first multiline controller is connected to a ground end, and a plurality of first connection pins of the first multiline controller are connected to the first connection end of the at least one group of row control circuits; each of the at least one group of column control circuits comprises a second multiline controller, and an enable pin and a control pin of the second multiline controller are both connected to the control end of the at least one group of column control circuits; a plurality of first connection pins of the second multiline controller are connected to the first connection end of the at least one group of column control circuits, and a second connection pin of the second multiline controller is connected to the second connection end of the at least one group of column control circuits.

4. The detection circuit based on equipotential shielding for detecting an array piezoresistive sensor according to claim 3, wherein a decoupling capacitor is connected to a power supply pin of the second multiline controller, and another end of the decoupling capacitor is connected to the ground end.

5. The detection circuit based on equipotential shielding for detecting an array piezoresistive sensor according to claim 2, wherein a decoupling capacitor is connected to a positive electrode of the operational amplifier, and another end of the decoupling capacitor is connected to a ground end.

6. The detection circuit based on equipotential shielding for detecting an array piezoresistive sensor according to claim 1, wherein the first connection end of the at least one group of row control circuits is provided with a first interface, the input end of the inverse adder is provided with a second interface, and input ends of all the inverse adders are connected to the second interface.

7. An apparatus for detecting an array piezoresistive sensor, comprising: the detection circuit based on equipotential shielding for detecting an array piezoresistive sensor according to claim 1.

* * * * *